(12) United States Patent
Machuca et al.

(10) Patent No.: US 8,956,952 B2
(45) Date of Patent: Feb. 17, 2015

(54) MULTILAYER SUBSTRATE STRUCTURE AND METHOD OF MANUFACTURING THE SAME

(71) Applicant: Tivra Corporation, Pleasant Hill, CA (US)

(72) Inventors: Francisco Machuca, Oakland, CA (US); Indranil De, Mountain View, CA (US)

(73) Assignee: Tivra Corporation, Pleasant Hill, CA (US)

( * ) Notice: Subject to any disclaimer, the term of this patent is extended or adjusted under 35 U.S.C. 154(b) by 4 days.

(21) Appl. No.: 13/794,327

(22) Filed: Mar. 11, 2013

(65) Prior Publication Data

US 2013/0334568 A1    Dec. 19, 2013

Related U.S. Application Data

(60) Provisional application No. 61/662,918, filed on Jun. 22, 2012, provisional application No. 61/659,944, filed on Jun. 14, 2012.

(51) Int. Cl.
*H01L 21/46* (2006.01)
*H01L 21/02* (2006.01)
(Continued)

(52) U.S. Cl.
CPC .......... *C30B 29/40* (2013.01); *H01L 21/02488* (2013.01); *C30B 19/12* (2013.01); *C30B 1/12* (2013.01); *H01L 21/0237* (2013.01);
(Continued)

(58) Field of Classification Search
CPC ................... H01L 21/02436; H01L 21/02304; H01L 21/02496; H01L 21/02505; H01L 21/02516; C30B 29/40; C30B 25/183
See application file for complete search history.

(56) References Cited

U.S. PATENT DOCUMENTS 7,229,500 B2   6/2007  Haushalter et al.
7,435,300 B2   10/2008 Ling et al.
(Continued)

FOREIGN PATENT DOCUMENTS

EP    0 499 982 A1    8/1992

OTHER PUBLICATIONS

Phase Diagram Images and Software from the National Physical Laboratory (NPL) for the Zr-Ti System, May 4, 2000 [online], [retrieved on Nov. 12, 2013], Retrieved from the Internet: <URL: http://resource.npl.co.uk/mtdata/phdiagrams/png/hfzr.png>, p. 1.

(Continued)

*Primary Examiner* — Eva Y Mantalvo
(74) *Attorney, Agent, or Firm* — Alston & Bird LLP

(57) ABSTRACT

A multilayer substrate structure comprises a substrate, a thermal matching layer formed on the substrate and a lattice matching layer above the thermal matching layer. The thermal matching layer includes at least one of molybdenum, molybdenum-copper, mullite, sapphire, graphite, aluminum-oxynitrides, silicon, silicon carbide, zinc oxides, and rare earth oxides. The lattice matching layer includes a first chemical element and a second chemical element to form an alloy. The first and second chemical element has similar crystal structures and chemical properties. The coefficient of thermal expansion of the thermal matching layer and the lattice parameter of the lattice matching layer are both approximately equal to that of a member of group III-V compound semiconductors. The lattice constant of the lattice matching layer is approximately equal to that of a member of group III-V compound semiconductor.

23 Claims, 3 Drawing Sheets

(51) Int. Cl.

| | | |
|---|---|---|
| *C30B 19/12* | (2006.01) | |
| *C30B 1/12* | (2006.01) | |
| *C30B 23/02* | (2006.01) | |
| *C30B 30/02* | (2006.01) | |
| *C30B 25/02* | (2006.01) | |
| *C30B 23/06* | (2006.01) | |
| *C30B 23/08* | (2006.01) | |
| *C30B 11/14* | (2006.01) | |
| *C30B 25/06* | (2006.01) | |
| *C30B 13/34* | (2006.01) | |
| *C30B 1/02* | (2006.01) | |
| *H01L 29/205* | (2006.01) | |
| *C30B 15/00* | (2006.01) | |
| *C30B 29/40* | (2006.01) | |
| *C30B 25/18* | (2006.01) | |

(52) U.S. Cl.
CPC ............ *C30B 23/02* (2013.01); *C30B 30/02* (2013.01); *C30B 25/02* (2013.01); *C30B 23/066* (2013.01); *H01L 21/0254* (2013.01); *C30B 23/08* (2013.01); *H01L 21/02439* (2013.01); *C30B 11/14* (2013.01); *C30B 25/06* (2013.01); *C30B 13/34* (2013.01); *C30B 1/02* (2013.01); *H01L 21/02502* (2013.01); *H01L 29/205* (2013.01); *C30B 15/007* (2013.01); *H01L 21/02436* (2013.01); *C30B 25/183* (2013.01)
USPC ................ 438/455; 438/457; 257/615

(56) References Cited

U.S. PATENT DOCUMENTS

| | | |
|---|---|---|
| 2003/0017626 A1 | 1/2003 | Hilt et al. |
| 2003/0043872 A1 | 3/2003 | Yokozeki et al. |
| 2009/0278164 A1 | 11/2009 | Osawa et al. |

OTHER PUBLICATIONS

Adachi, "2 Thermal Properties 2.1 Melting Point and Related Parameters 2.1.1 Phase diagram," *Properties of Semiconductor Alloys: Group IV, III-V and II-VI Semiconductors*, table 2.1 (2009).
Cverna, ASM Ready Reference: Thermal Properties of Metals (#06702G), Chapter 2: *Thermal Expansion, ASM International*, table 2.1 (2002).
PCT/US2013/045482 International Search Report and Written Opinion of the International Searching Authority, mailed Mar. 5, 2014.
PCT/US2013/045482 Invitation to Pay Additional Fees, mailed Dec. 17, 2013.

MULTILAYER SUBSTRATE STRUCTURE AND METHOD OF MANUFACTURING THE SAME

CROSS-REFERENCE TO RELATED APPLICATION

This application claims priority of provisional applications 61/662,918, filed on Jun. 22, 2012 and 61/659,944, filed on Jun. 14, 2012, the contents of which are incorporated herein by reference in their entireties.

TECHNICAL FIELD

The example embodiments of the present invention generally pertain to semiconductor materials, methods, and devices, and more particularly to a multilayer substrate structure for epitaxial growth of group III-V compound semiconductors.

BACKGROUND

Group III-V compound semiconductor, such as gallium nitride (GaN), gallium arsenide (GaAs), indium nitride (InN), aluminum nitride (AlN) and gallium phosphide (GaP), are widely used in the manufacture of electronic devices, such as microwave frequency integrated circuits, light-emitting diodes, laser diodes, solar cells, high-power and high-frequency electronics, and opto-electronic devices. To improve throughput and reduce manufacturing cost it is desired to increase size (e.g., diameter) of substrates. Because growing III-V compound semiconductors of large size is very expensive a great number of foreign materials including metals, metal oxides, metal nitrides as well as semiconductors, such as silicon carbide (SiC), sapphire and silicon, are commonly used as substrates for epitaxial growth of III-V compound semiconductors.

However, epitaxy growth of group III-V compound semiconductors (e.g., GaN) on substrates (e.g., sapphire) poses many challenges on crystalline quality (e.g., grain boundaries, dislocations and other extended defects, and point defects) of the epitaxial layers due to lattice mismatch and coefficient of thermal expansion mismatch between the GaN layer and the underlying substrate, a foreign material. Differences in the coefficient of thermal expansion between the GaN layer and the underlying substrate result in large curvatures across the wafer, resulting during and post processing upon returning to room temperature, and the large mismatch in lattice constants leads to a high dislocation density, unwanted strain and defects propagating into the epitaxial GaN layer. In order to cope with these problems, stress relaxation strategies are employed, such as growing buffer layers between the GaN layer and the sapphire substrate, or counter balancing compressive and tensile strain by alternating appropriate material layers. However, by adding the buffer layer or stress relieving layers, the dislocation density may remain high and the manufacturing cost and complexity increases significantly because of the use of the same deposition techniques involved in growing the active device layers.

BRIEF SUMMARY

According to one exemplary embodiment of the present invention, a multilayer substrate structure comprises a substrate, a thermal matching layer formed on the substrate a lattice matching layer above the thermal matching layer. The thermal matching layer includes at least one of molybdenum, molybdenum-copper, mullite, sapphire, graphite, aluminum-oxynitrides, silicon, silicon carbide, zinc oxides, and rare earth oxides. The lattice matching layer includes a first chemical element and a second chemical element to form an alloy. The first and second chemical element has similar crystal structures and chemical properties. The coefficient thermal expansion of the thermal matching layer is approximately equal to that of a member of group III-V compound semiconductors.

According to one exemplary embodiment of the present invention, a method of fabricating a multilayer substrate structure comprises providing a substrate, growing a thermal matching layer on the substrate. The thermal matching layer comprises at least one of molybdenum, molybdenum-copper, mullite, sapphire, graphite, aluminum-oxynitrides, silicon, silicon carbide, zinc oxides, and rare earth oxides. The method also comprises growing a lattice matching layer above the thermal matching layer. The lattice matching layer includes a first chemical element and a second chemical element to form an alloy. The first and second chemical element has similar crystal structures and chemical properties. The coefficient thermal expansion of the thermal matching layer is approximately equal to that of a member of group III-V compound semiconductors.

BRIEF DESCRIPTION OF THE DRAWING(S)

Having thus described the example embodiments of the present invention in general terms, reference will now be made to the accompanying drawings, which are not necessarily drawn to scale, and wherein:

DETAILED DESCRIPTION

The various embodiments are described more fully with reference to the accompanying drawings. These example embodiments are provided so that this disclosure will be thorough and complete, and will fully convey the scope of the invention to readers of this specification having knowledge in the technical field. Like numbers refer to like elements throughout.

Figure 1A:
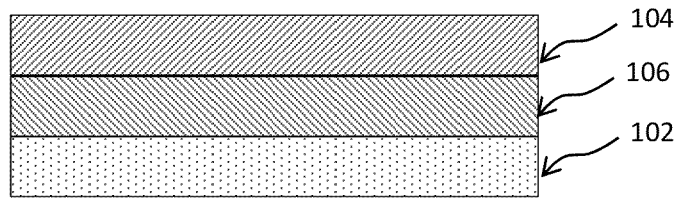
FIGS. 1A-1D illustrate cross-sectional views of exemplary multilayer substrate structures in accordance with exemplary embodiments.

FIG. 1A illustrates a cross-sectional view of an exemplary multilayer substrate structure 100 in accordance with an exemplary embodiment. The multilayer substrate structure 100 may include a substrate 102 and an epitaxial layer 104 epitaxially grown on the substrate 100. Depending on various applications, the substrate 102 may comprise a semiconductor material, a compound semiconductor material, or other type of material such as a metal or a non-metal. For example, the material may comprise molybdenum, molybdenum-copper, mullite, sapphire, graphite, aluminum-oxynitrides, silicon, silicon carbide, zinc oxides and rare earth oxides, and/or other suitable material.

Figure 2A:
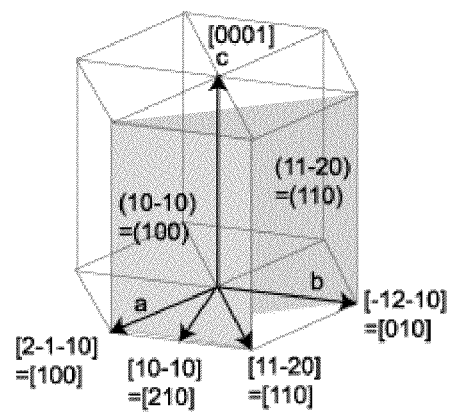
FIG. 2A illustrates a schematic of a hexagonal close-packed structure.
Figure 2B:
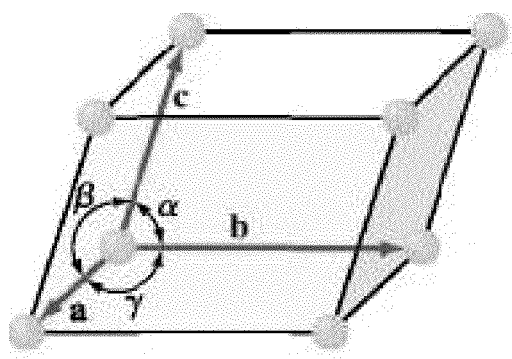
FIG. 2B illustrates a schematic of a unit cell showing lattice constants.
Figure 3:
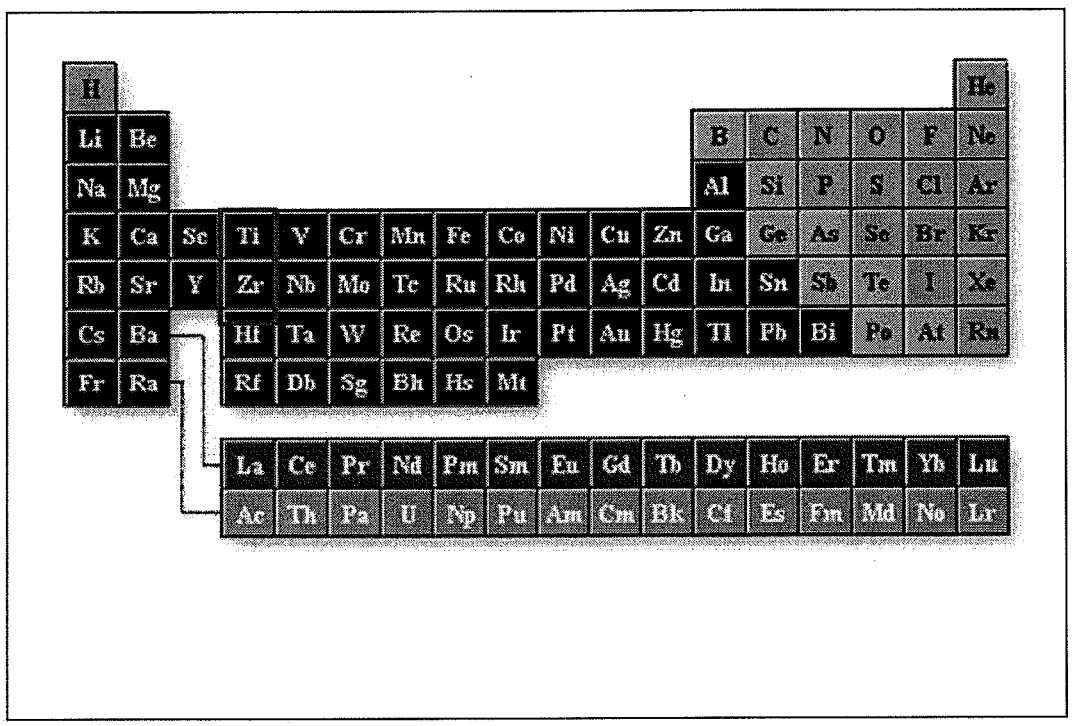
FIG. 3 illustrates a periodic table.

The epitaxial layer 104 may include group III-V compound semiconductors, such as aluminum nitride (AlN), gallium nitride (GaN), indium gallium nitride (InGaN) and indium nitride (InN). As described above, there may be a lattice constant mismatch between the substrate 102 and the epitaxial layer 104. To decrease or eliminate the defects resulting from the lattice constant mismatch, the epitaxial layer 104 growth on the substrate 102 may use a lattice matching layer 106 with thickness in a range of 5 nm-100 nm to accommodate the lattice constant mismatch between the substrate 102 and the epitaxial layer 104. The lattice matching layer 106 may comprise two or more constituent elements, for example of two constituents, a first chemical element and a second chemical element, to form an alloy. The first chemical element is miscible with the second chemical element in this alloy. The constituent elements may have similar crystal structures at room temperature, such as hexagonal close-packed structure, as shown in FIG. 2A. Each of the constituent elements may have its respective lattice constants including lattice parameters along a-axis, b-axis and c-axis, and lattice parameters of interaxial angles α, β and γ, as shown in FIG. 2B. In addition to the crystal structures, the constituent elements may have similar chemical properties. In one embodiment, the first and second chemical elements may both belong to group four elements (namely, titanium (Ti), zirconium (Zr), hafnium (Hf) and rutherfordium (Rf)) in periodic table illustrated in FIG. 3. In this way, the alloy may be made from elements Ti and Zr, elements Ti and Hf, and elements Zr and Hf and may have similar crystal structure to the constituent elements at room temperature, or by any combination of 2. The alloy may comprise a third chemical element or more elements which have similar crystal structures and similar chemical properties.

A linear relation may exist between the first and second chemical elements and their associated lattice parameters at constant temperature to allow the lattice constant of the lattice matching layer 106 to be approximately equal to that of the epitaxial layer 104. The mole fraction in atomic percentage of the first chemical element to the second chemical element is $P_1$ to $(1-P_1)$. The mole fraction may vary from application to application, as the composition will control the resulting lattice parameter value of the alloy. In one embodiment, when the epitaxial layer 104 includes GaN and the alloy includes Ti mixed with Zr, atomic percentage $P_{Zr}$ of Zr may be greater than 75% and less than 90%. For example, $P_{Zr}$ may be about 86%. It follows that atomic percentage $P_{Ti}$ of Ti is $(1-P_{Zr})$. A first lattice parameter of Zr, e.g., a-axis lattice parameter $a_{Zr}$ is 3.23 Å. A second lattice parameter of Ti, e.g., a-axis lattice parameter $a_{Ti}$ is 2.951 Å. As a result, lattice constant $P_A$ along a-axis of the alloy is $P_{Zr} \times a_{Zr} + (1-P_{Zr}) \times a_{Ti} = 86\% \times 3.23 + 14\% \times 2.951 = 3.19$ Å which is approximately equal to the a-axis lattice constant $P_{GaN}$ of hexagonal close-packed GaN where $P_{GaN} = 3.189$ Å. Depending on the constituent elements and other factors, the atomic percentage of the first chemical element to the second chemical element may be about 43% to 57% or 99% to 1%.

When the epitaxial layer 104 includes different compound semiconductors (e.g., AlN, InGaN, InN and/or other group III-V compound semiconductors), the constituent elements of the lattice matching layer 106 and/or the mole fractions of the constituent elements may be adjusted to make the lattice constant of the lattice matching layer 106 accommodate that of the epitaxial layer 104. For example, when the epitaxial layer 104 comprises AlN and the constituent elements of the lattice matching layer 106 are Zr and Ti, the atomic percentage of Zr may be adjusted to be lower than 75% and higher than 50%. In another embodiment using the same constituent elements, when the epitaxial layer 104 comprises InGaN, the atomic percentage of Zr may be greater than 90%. In addition to the material of the epitaxy layer 104, the thickness of the epitaxial layer 104 may cause the changes of the selection of the constituent elements as well as mole fraction of the constituent elements to achieve 100% lattice match. Despite the changes of the thickness of the epitaxial layer 104, it may be in a range of 5 nm-500 nm. In other words, the thickness and the material of the epitaxial layer 104 may determine the selection of the constituent elements and their mole fraction in forming the lattice matching layer 106. By using any epitaxial techniques, such as vacuum evaporation, sputtering, molecular beam epitaxy and pulsed laser deposition, metalorganic chemical vapor deposition, atomic layer deposition and/or any other suitable epitaxial deposition methods, the epitaxial layer 104 is epitaxially grown on the lattice matching layer 106 to transfer the crystallographic pattern of the lattice matching layer 106 to the epitaxial layer 104. The lattice matching layer 106 may be formed on the underlying layer, for example, the substrate 102 using one of deposition techniques, such as vacuum evaporation, sputtering, molecular beam epitaxy and pulsed laser deposition, atmospheric chemical vapor deposition, and atomic layer deposition.

Figure 4:
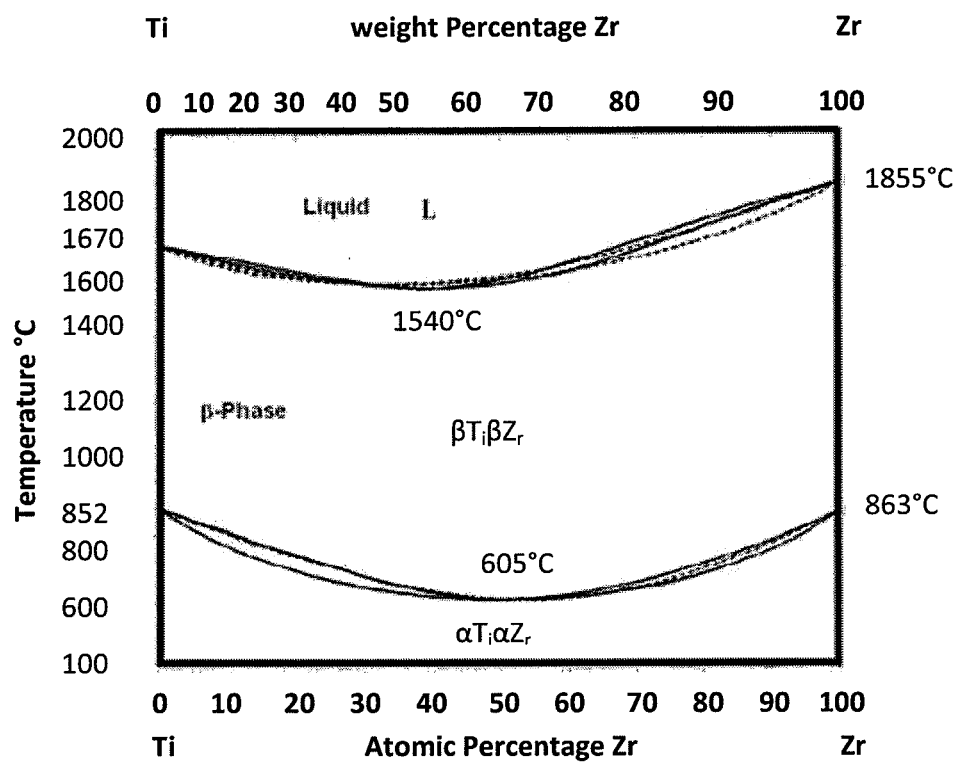
FIG. 4 illustrates a phase diagram correlation between transition temperature and atomic percentage of constituent elements in accordance with an exemplary embodiment.

Because hexagonal close packed phase (α phase) has potential superiority over the body centered cubic phase (β phase) for certain opto-electronic devices and power semiconductor applications, it may be desired to grow the epitaxial layer 104 in α phase to achieve similar crystallographic pattern of the lattice matching layer 106. FIG. 4 shows a correlation between the α-β phase transition temperature and the atomic percentage of Zr and Ti in accordance with an exemplary embodiment. For example, when $P_{Zr}$ is 50%, $P_{Ti} = 1 - P_{Zr} = 50\%$, the α-β phase transition temperature is about 605° C. When $P_{Zr}$ is 84%, an example that has been illustrated above, the α-β phase transition temperature may be about 780° C. In an application of fabricating multi-quantum-well (MQW) devices on the epitaxial layer 104 (e.g. ultra high brightness LEDs), the epitaxial deposition method, such as metal organic chemical vapor deposition and atomic layer deposition and/or any other suitable methods for epitaxial growth, may be performed in a temperature range of 700° C.~850° C. In this embodiment, the multilayer substrate structure may be heated by any heating methods/heat sources under the α-β phase transition temperature 780° C. but greater than 700° C. in an attempt to transfer the crystallographic pattern of the lattice matching layer 106 to the epitaxial layer 104 in α phase, avoiding β phase transition. Then the temperature for heating the multilayer substrate structure during subsequent MQW growth, along with any additional device layers, can be raised above or lowered below 780° C. since epitaxial layer 104 has been formed and is permanently set in the α phase. The temperature may be initially raised above the α-β phase transition and then immediately dropped below α-β phase transition temperature to invoke generating phase transition free energy to crystallize large lateral areas resulting in single crystal α-phase in the lattice matching layer.

By introducing the lattice matching layer 106, the stresses may be lowered that might otherwise occur in the epitaxial layer 104 developed during the epitaxy growth as a result of difference in lattice constants between the substrate 102 and the epitaxial layer 104, and by doing so, aids in the growth of a high crystalline quality epitaxial layer 104. If such stress is not relieved by the lattice matching layer, the stress may cause defects in the crystalline structure of the epitaxial layer 104. Defects in the crystalline structure of the epitaxial layer 104, in turn, would make it difficult to achieve a high quality crystalline structure in epitaxy for any subsequent device growth. The lattice matching layer 106 is also disclosed in U.S. patent application entitled "A Lattice Matching Layer for Use In A Multilayer Substrate Structure."

Figure 1B:
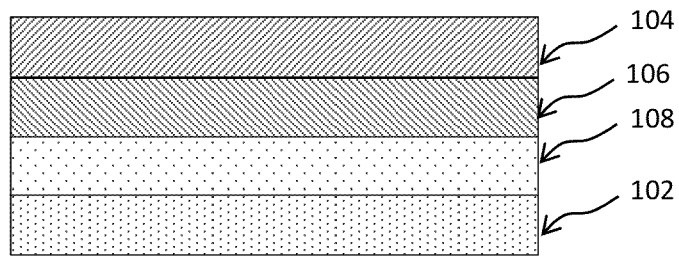

As described above, the substrate 102 may comprise a semiconductor material, a compound semiconductor material, or another type of material such as a metal or a non-metal. In some embodiments, the substrate 102 may be in the form of a polycrystalline solid. Polycrystalline substrates may negatively impact the lattice matching layer 106 by making it polycrystalline instead of single crystal, thus enlarging the difference of lattice constants between the lattice matching layer 106 and the epitaxial layer 104 (an average lattice constant over multiple grains and multiple crystalline orientations), and causing extended defects such as threading dislocations or grain boundaries, leading to poor crystalline quality of the epitaxial layer 104. To reduce or eliminate the negative impact of a polycrystalline substrate, an amorphous layer 108 may be introduced between the polycrystalline substrate 102 and the lattice matching layer 106, as shown in FIG. 1B. By adding the amorphous layer 108 between the polycrystalline substrate 102 and the lattice matching layer 106, the impact of the polycrystalline substrate 102 on the lattice matching layer 106 may be reduced. In this way, only crystallography of the lattice matching layer 106 is transferred to the epitaxial layer 104. The amorphous layer 108 may comprise, but not limited to, one of silicon dioxide, silicon nitride, tantalum nitride, boronitride, tungsten nitride, glassy amorphous carbon, silicate glass (e.g., borophosphosilicate glass and phosphosilicate glass) and/or other suitable materials. The amorphous layer 108 may have a thickness of 5 nm to 100 nm.

Figure 1C:
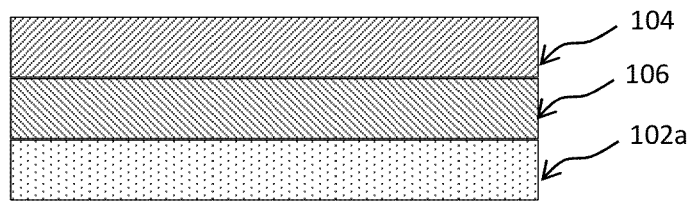
Figure 1D:
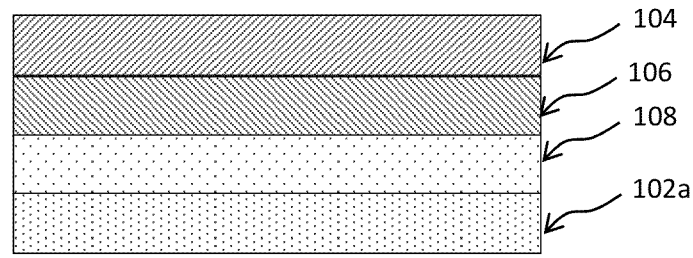

In some embodiments, the coefficient of thermal expansion of the substrate 102 may be different than that of the above layers, resulting in large substrate curvatures. For example, when the coefficient of thermal expansion of the substrate 102 is greater than that of the above layers, biaxial compressive strain arises (e.g. when the substrate comprises sapphire). When the coefficient of thermal expansion of the substrate is less than that of the above layers, tensile strain arises (e.g. when the substrate comprises silicon). To overcome the drawback caused by the mismatch in the coefficient of thermal expansion, the substrate may be used as a thermal matching layer 102a (shown in FIGS. 1C and 1D) by including some chemical elements to accommodate the thermal mismatch between the substrate (namely, the thermal matching layer 102a in this embodiment) and the lattice matching layer 106 as shown in FIG. 1C, or between the substrate and the amorphous layer 108 as shown in FIG. 1D. In one embodiment, the thermal matching layer 102a may comprise molybdenum or its related alloys. The coefficient of thermal expansion of molybdenum is about $5.4 \times 10^{-6}$/K which is approximately equal to that of some group III-V compound semiconductors, such as GaN. The substrate may be fabricated using a variety of methods for growth of metals, crystals, and their alloys. Example may include Czochralski, float zone (FZ), directional solidification (DS), zone melt recrystallization (ZMR), sintering, isostatic pressing, electro-chemical plating, plasma torch deposition, and/or other suitable methods. The thermal matching layer 102a has a thickness in a range of 5 nanometer to 1 millimeter.

By introducing the thermal matching layer and the lattice matching layer, the strain caused by the thermal expansion mismatch and lattice mismatch may be reduced or completely eliminated. As a result, the dislocation density may be less than $10^2/cm^2$ (<100 dislocations per square centimeter) in the resulting epitaxial layer 104. In development of light emitting diodes (LEDs), the reduction or elimination of the strain may fulfill requirements to overcome the so-called "green gap."

The "green gap" is an industry expression for a droop or decrease in LED light output from MQW LEDs that alloy indium with GaN to fabricate green LED's. This droop in green light outputted occurs for forward currents>50 mA in 1 to 5 square millimeter device areas due to defect density resulting from excessive strain from substrates, stress induced extended defects and point defects propagating into active MQW device layers.

Because the human eye is most sensitive to green and green light strongly affects the human perception to the quality of white light, the present embodiment enables high crystalline quality devices grown on layer 104. Moreover, exemplary embodiments of the present invention qualify a cost effective manner of manufacturing a green LED crystalline template. As such, the fulfilling of the "green gap" may enhance the high performance of white light emitting diodes based on mixing light from red, green and blue, having the highest theoretical efficacies over phosphor based down conversion LEDs used today.

Many modifications and other example embodiments set forth herein will bring to mind to the reader knowledgeable in the technical field to which these example embodiments pertain to having the benefit of the teachings presented in the foregoing descriptions and the associated drawings. Therefore, it is to be understood that the embodiments are not to be limited to the specific ones disclosed and that modifications and other embodiments are intended to be included within the scope of the claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims.

What is claimed is:

1. A multilayer substrate structure comprising:
    a substrate,
    a thermal matching layer formed on the substrate, the thermal matching layer including at least one of molybdenum, molybdenum-copper, mullite, sapphire, graphite, aluminum-oxynitrides, silicon, silicon carbide, zinc oxides, and rare earth oxides; and
    a lattice matching layer above the thermal matching layer, the lattice matching layer including a first chemical element and a second chemical element to form an alloy, the first and second chemical element having similar crystal structures and chemical properties,
    wherein the coefficient of thermal expansion of the thermal matching layer is approximately equal to that of a member of group III-V compound semiconductor,
    wherein the lattice constant of the lattice matching layer is approximately equal to that of a member of group III-V compound semiconductor.

2. The multilayer substrate structure of claim 1 further comprising an epitaxial layer epitaxially grown on the lattice matching layer, the epitaxial layer including the member of group III-V compound semiconductor with a hexagonal close-packed structure.

3. The multilayer substrate structure of claim 1, wherein a linear relation exists between the first and second chemical elements and their associated lattice parameters at constant temperature to allow lattice constant of the alloy approximately equal to that of the member of group III-V compound semiconductor.

4. The multilayer substrate structure of claim 1, wherein at least one of the first and the second chemical elements belongs to group four elements in periodic table.

5. The multilayer substrate structure of claim 1, wherein the mole fraction in terms of atomic percentage of the first chemical element to the second chemical element is about 14% to 86%.

6. The multilayer substrate structure of claim 1, wherein the mole fraction in terms of atomic percentage of the first chemical element to the second chemical element is about 43% to 57%.

7. The multilayer substrate structure of claim 1, wherein the mole fraction in terms of atomic percentage of the first chemical element to the second chemical element is about 99% to 1%.

8. The multilayer substrate structure of claim 1 wherein the lattice matching layer further comprising a third chemical element, wherein the third chemical element has similar crystal structures and similar chemical properties to the first and second chemical elements and wherein the third chemical element is miscible with the first and second chemical elements to form the alloy, a linear relation exists between the first, second and third chemical elements and their associated lattice parameters at constant temperature to allow the lattice constant of the alloy to be approximately equal to that of the member of group III-V compound semiconductors.

9. The multilayer substrate structure of claim 1, wherein the coefficient of thermal expansion of the alloy along a plane is approximately equal to that of the member of group III-V compound semiconductor along the same plane.

10. The multilayer substrate structure of claim 1, wherein the group III-V compound semiconductor comprises one of aluminum nitride (AlN), gallium nitride (GaN), indium gallium nitride (InGaN) and indium nitride (InN).

11. The multilayer substrate structure of claim 1, wherein the thermal matching layer has a thickness in a range of 5 nanometer to 1 millimeter.

12. The multilayer substrate structure of claim 1 further comprising an amorphous layer between the thermal matching layer and the lattice matching layer, wherein the amorphous layer comprises one of silicon dioxide, tantalum nitride, boronitride, tungsten nitride, silicon nitride, glassy amorphous carbon and silicate glass.

13. The multilayer substrate structure of claim 12, wherein the amorphous layer has a thickness in a range of 5 nm-100 nm.

14. The multilayer substrate structure of claim 1, wherein the lattice matching layer has a thickness in a range of 5 nm-100 nm.

15. A method of fabricating a multilayered substrate, comprising
providing a substrate,
forming a thermal matching layer on the substrate, the thermal matching layer comprising at least one of molybdenum, molybdenum-copper, mullite, sapphire, graphite, aluminum-oxynitrides, silicon, silicon carbide, zinc oxides, and rare earth oxides; and
growing a lattice matching layer above the thermal matching layer, the lattice matching layer including a first chemical element and a second chemical element to form an alloy, the first and second chemical element having similar crystal structures and chemical properties,
wherein the coefficient thermal expansion of the thermal matching layer is approximately equal to that of a member of group III-V compound semiconductor,
wherein the lattice constant of the lattice matching layer is approximately equal to that of a member of group III-V compound semiconductor.

16. The method of claim 15 further comprising interpolating the coefficient of thermal expansion of the first chemical element and coefficient of thermal expansion of the second chemical element along a plane to arrive at a first order estimate of the coefficient of thermal expansion of the alloy along the same plane, wherein the coefficient of thermal expansion of the alloy is about that of the member of group III-V compound semiconductor along the same plane.

17. The method of claim 15 further comprising interpolating the lattice constant of the first chemical element and the lattice constant of the second chemical element along a plane to arrive at a first order estimate of the lattice constant of the alloy along the same plane, wherein the lattice constant of the alloy is about that of the member of group III-V compound semiconductor along the same plane.

18. The method of claim 15 further comprising growing an epitaxial layer on the lattice matching layer, the epitaxial layer including the member of group III-V compound semiconductor with a hexagonal close-packed structure.

19. The method of claim 17 further comprising heating the multilayer substrate structure below an $\alpha$-$\beta$ phase transition temperature to allow epitaxial growth of the epitaxy layer on the lattice matching layer in the correct $\alpha$ phase.

20. The method of claim 15 further comprising heating the multilayer substrate structure above an $\alpha$-$\beta$ phase transition temperature and immediately dropping below the $\alpha$-$\beta$ phase transition temperature to invoke generating phase transition free energy to crystallize large lateral areas resulting in a single crystal $\alpha$-phase in the lattice matching layer.

21. The method of claim 15 further comprising fabricating the thermal matching layer using one of Czochralski, float zone (FZ), directional solidification (DS) zone melt recrystallization (ZMR), sintering, isostatic pressing, electrochemical plating and plasma torch deposition.

22. The method of claim 15 further comprising growing the lattice matching layer by one of vacuum evaporation, sputtering, molecular beam epitaxy and pulsed laser deposition, atmospheric chemical vapor deposition, and atomic layer deposition.

23. The method of claim 15 further comprising growing the lattice matching layer on an amorphous layer, wherein the amorphous layer comprises one of silicon dioxide, tantalum nitride, boronitride, tungsten nitride, silicon nitride, glassy amorphous carbon and silicate glass.

* * * * *